United States Patent [19]

Drehman et al.

[11] Patent Number: 5,378,341

[45] Date of Patent: Jan. 3, 1995

[54] CONICAL MAGNETRON SPUTTER SOURCE

[75] Inventors: Alvin J. Drehman, Chelmsford; William M. Hale, N. Scituate, both of Mass.

[73] Assignee: The United States of America as represented by the Secretary of the Air Force, Washington, D.C.

[21] Appl. No.: 135,827

[22] Filed: Oct. 13, 1993

[51] Int. Cl.⁶ ........................ C23C 14/35; H01L 39/24
[52] U.S. Cl. .......................... 204/298.18; 204/192.24; 204/298.17; 505/475; 505/476
[58] Field of Search .................. 204/298.18, 298.17, 204/192.24; 505/475–476

[56] References Cited

U.S. PATENT DOCUMENTS

| | | | |
|---|---|---|---|
| 4,060,470 | 11/1977 | Clarke | 204/192.12 |
| 4,100,055 | 7/1978 | Rainey | 204/298.12 |
| 4,179,351 | 12/1979 | Hawton, Jr. et al. | 204/298.09 |
| 4,472,259 | 9/1984 | Class et al. | 204/298.18 |
| 4,622,121 | 11/1986 | Wegmann et al. | 204/298.18 |
| 4,657,654 | 4/1987 | Mintz | 204/298.12 |
| 4,673,480 | 6/1987 | Lamont, Jr. | 204/298.18 |
| 4,810,347 | 3/1989 | Smith | 204/298.18 |
| 4,834,860 | 5/1989 | Demaray et al. | 204/298.18 |
| 4,842,703 | 6/1989 | Class et al. | 204/192.12 |
| 4,909,314 | 3/1990 | Lamont, Jr. | 165/80.3 |
| 5,024,747 | 6/1991 | Turner et al. | 204/298.09 |
| 5,135,634 | 8/1992 | Clarke | 204/298.06 |
| 5,194,131 | 3/1993 | Anderson | 204/192.12 |

FOREIGN PATENT DOCUMENTS 61-183467 8/1986 Japan .................. 204/298.18

*Primary Examiner*—Aaron Weisstuch
*Attorney, Agent, or Firm*—Stanton E. Collier; Jacob N. Erlich

[57] ABSTRACT

The sputtering source of the present invention comprises a means for providing DC or RF power and cooling to a conical target electrode with magnets thereabout and anode at the bottom. At the center of the sputtering source is a grounded anode. A plurality of magnets which form rings are located behind the conical target electrode so that the magnetic field lines point to the anode. The conical target electrode has an inner surface which is slightly inclined from a centerline. The conical target electrode is concentrically located about the vertical centerline. A ground shield is placed about and above the magnets and the conical electrode and further acts to eliminate high energy ions from reaching the substrate because of the shape thereof. An opening in the shield allows for the exit of low energy particles of the target material sputtered from the conical target electrode. The sputtering source provides a narrow beam of target material for deposition on a substrate located at a distance from the source.

6 Claims, 1 Drawing Sheet

CONICAL MAGNETRON SPUTTER SOURCE

STATEMENT OF GOVERNMENT INTEREST

The invention described herein may be manufactured and used by or for the Government for governmental purposes without the payment of any royalty thereon.

BACKGROUND OF THE INVENTION

The present invention relates to devices for depositing thin films, and, in particular, relates to a sputtering source.

The sputtering apparatus may be an open-ended cathode and an anode structure in an evacuated chamber typically containing less than 1 Torr pressure of an ionizable gas. A DC or RF source causes the target material to have a net negative charge (i.e., being the cathode) which pulls positively charged ions out of the plasma. These ions impact the target material causing atoms, ions and small (possibly ionized) atom clusters to be ejected from the target surface. This ejected material is free to move through the surrounding gas and deposit upon any surface that it encounters, in particular, a substrate material upon which this depositing material will form a film. This material deposits on a substrate located either within or outside of the sputtering source.

In one prior sputtering device, U.S. Pat. No. 4,060,470, the cathode is a conical structure having a large opening toward the substrate so as to provide a relatively wide angle of emergence of the sputtered material. The use of magnetic and electric fields provides additional control of the sputtering materials.

Another prior sputtering device, U.S. Pat. No. 4,842,703, uses magnetic and electric fields as well as a cathode structure having a flat bottom and conical sides for coating the substrate uniformly. The angle of the conical sides from the vertical is very large.

Another prior sputtering device, U.S. Pat. No. 4,100,055, uses a cathode having an outer, middle and inner portions to control the ions.

The following U.S. Patents are incorporated by reference: U.S. Pat. Nos. 5,194,131; 5,024,747; 4,909,314; 4,842,703; 4,834,860; 4,657;654; 4,673,480; 4,179,351; 4,100,055; and 4,060,470.

SUMMARY OF THE INVENTION

The sputtering source of the present invention comprises a truncated conical target (cathode) with appropriate RF or DC feeds and cooling therein. The application of an RF or DC potential therein creates a plasma which contains electrons and positive ions. At the center of the sputtering source is a grounded anode. A plurality of magnets are located about the conical electrode being made of the sputtering target material so that the magnetic field lines point to the anode. Because of the arrangement of the magnets and the target electrode material being only slightly inclined from the vertical, the magnetic field enhances the plasma within the cone of the target material which increases the number of ions which impact the target material per second.

In normal sputtering geometries one has the situation that if the target material ejects negatively charged ions or clusters or if the sputter gas contains any gasses which readily form into negative ions or radicals (such as oxygen), then these negatively charged particles will be accelerated away from the negatively charged target surface. Although these charged particles may become electrically neutral upon encountering the plasma, their kinetic energy can remain quite high. If such particles then strike the substrate, then they can in turn cause material to be ejected from the growing film and/or damage the growing film. In the present geometry, these negative particles are accelerated away from the target surface and toward another target surface and not toward the substrate.

Therefore, one object of the present invention is to provide a conical magnetron sputter source which substantially eliminates the negative ion bombardment of the substrate to be coated.

Another object of the present invention is to provide a conical magnetron sputter source for use with materials that generate negative ions.

Another object of the present invention is to provide a conical magnetron sputter source for use in the deposition of thin films of high temperature superconducting oxide materials.

Another object of the present invention is to provide a conical sputter source having substantially known directional ability.

Another object of the present invention is to provide a conical electrode target for placement within the sputter source for reducing problems of machining and cooling.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Sputter deposition of high-temperature superconducting oxide films is complicated by several problems such as providing adequate oxygen to the depositing film so that the desired crystalline phase can be formed, and avoiding bombardment of the depositing film by high energy ions and/or atoms, which changes the stoichiometry of the depositing film and further prevent the incorporation of adequate oxygen and formation of the desired phase. Unfortunately, providing adequate oxygen typically results in the creation of negative oxygen ions which are repelled from the negatively charged sputter target and bombard the film as it deposits on the substrate.

Figure 1:
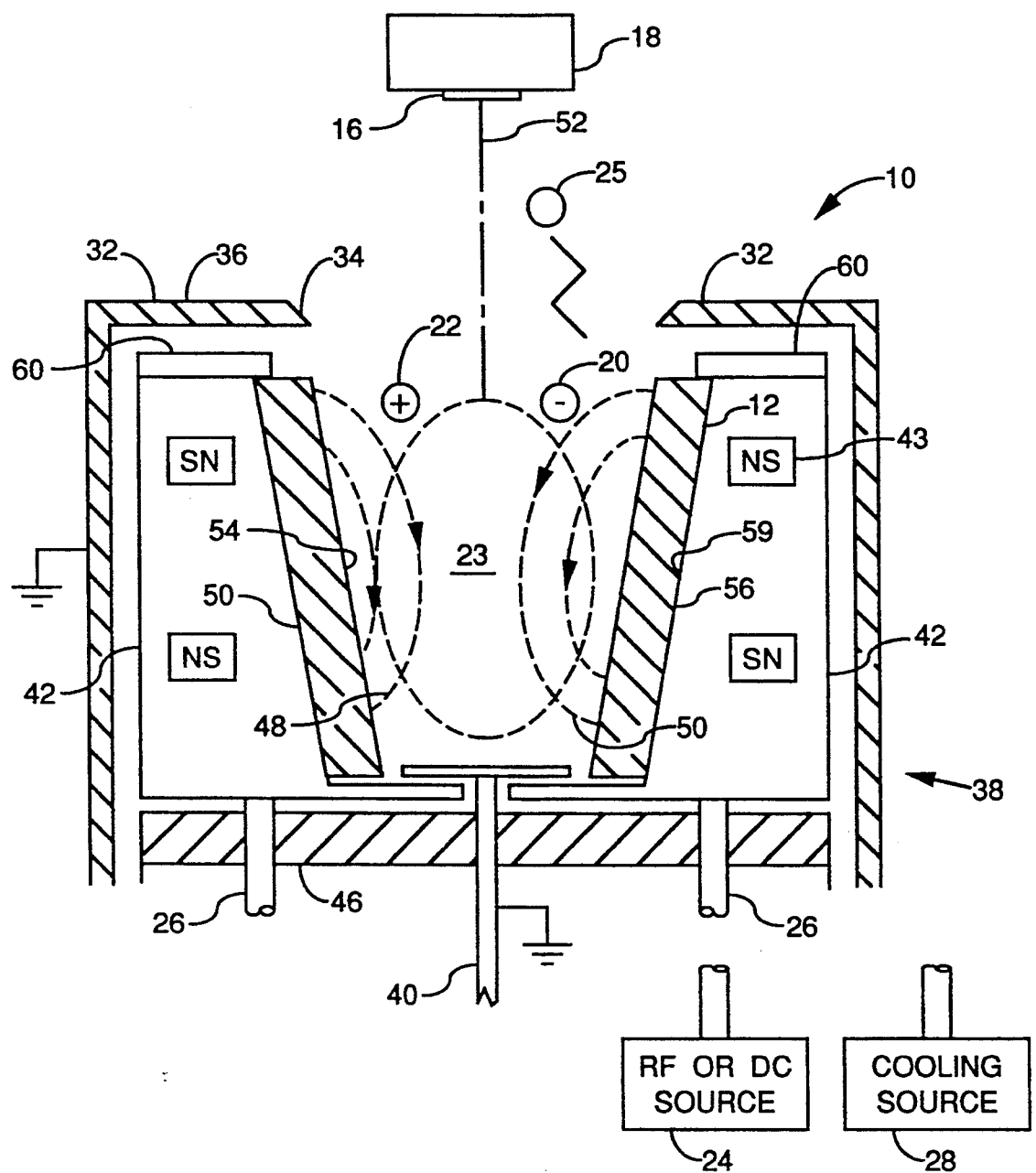
FIG. 1 of the present invention illustrates by cross sectional view the conical magnetron sputter source.

Referring to FIG. 1, a conical magnetron sputter source 10 is shown. The conical magnetron sputter source 10 is enclosed in a vacuum chamber, not shown, for the purpose of depositing a selected target material of a conical target electrode 12 onto a substrate 16 held over the sputter source 10 by holder 18. In the present invention, the target material ejects both charged and neutral particles as a result of the bombardment of positive ions 22 which are accelerated toward it due to its net negative potential. The negative potential is created by the DC or RF power source 24 which is applied to the target electrode 12 through the power and cooling feedthroughs 26 and a target electrode holder 42. The applied DC or RF power also creates and maintains the plasma 23. The negative ions or radicals 20, which are typically oxygen, are accelerated away from the target inner surface 54 towards the opposite surface 54 through the plasma and not toward the substrate 16. Neutral atoms or clusters of atoms which are of low energy can diffuse out of the sputter source 10 toward the substrate 16. No further illustration of the DC or RF power source 24, cooling source 28, or vacuum feedthroughs are shown. In the present invention, the vacuum chamber maintains an operating pressure in the range from about 5 to 500 mTorr. A grounded shield 32 is placed about the electrode 12 and has an opening 34 in a top 36 thereof. Mounted at a bottom 38 of the sputter source 10 is a grounded anode 40. To enhance the plasma, reduce the target voltage and increase the deposition rate, a plurality of magnets 43 are positioned above an insulator 46. The fields from the magnets 43 are shown as 48 and 50. Since an inner surface 54 of the conical target electrode 12 is only slightly inclined from a vertical direction 52, in a preferred range of 1 to 20 degrees, the negative ions are not accelerated in the direction of the substrate 16.

The conical target electrode 12 is shown as a truncated cone with the inner surface 54 substantially parallel to an outer surface 56. This structure is mounted within the target holder 42 which further has the magnets 43 therein. The target holder 42 has an inner surface 58 shaped to conform to the outer surface 56 of the conical electrode 12. A clamp 60 pushes the conical target electrode 12 into the inner surface 59 of the target holder 42 for close contact thus insuring necessary cooling. This feature further minimizes machining requirements if the conical target electrode is made of a sintered material for use as a target material.

Figure 2:
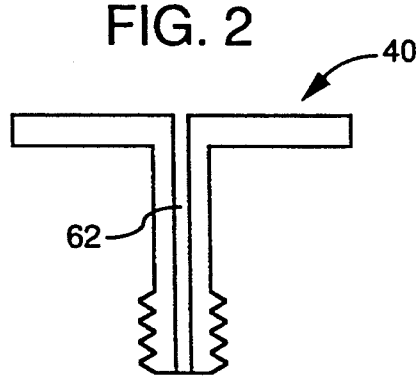
FIG. 2 of the present invention illustrates the anode having a gas channel therethrough.

Referring to FIG. 2, the anode 40 of FIG. 1 is shown having a gas channel 62 for inputting gas for the purposes of providing a net flux of gas out of the sputter source 10 to move the sputtered material toward the substrate 16 and providing a reactive gas such as oxygen in close proximity to the target electrode 12 and directed toward the substrate 16.

Clearly, many modifications and variations of the present invention are possible in light of the above teachings and it is therefore understood, that within the inventive scope of the inventive concept, the invention may be practiced otherwise than specifically claimed.

What is claimed is:

1. A magnetron sputter source, said magnetron sputter source for use in a thin film deposition apparatus, said source trapping substantially negative ions within said source, said magnetron sputter source comprising:
   means for applying DC or RF power for creating a plasma and for applying a net negative potential;
   means for applying cooling;
   a conical target electrode, said conical target electrode being made of a selected target material, said target material to be deposited on a substrate outside of said magnetron sputter source, said conical target electrode having a shape of a truncated cone, said conical target electrode having a top opening and a bottom opening, said top opening being larger than said bottom opening, said conical target electrode having a centerline therethrough, said conical target electrode having an inner surface and an outer surface, said inner surface being inclined at an angle of about 1 to 20 degrees to said centerline, said means for applying a net negative potential connected to said conical electrode, said means for applying power creating a plasma in the proximity of said conical target electrode, said means for applying cooling maintaining said conical target electrode in a desired temperature range;
   means for holding said conical target electrode, said means for holding having an inner surface therein, said inner surface being substantially conformal to said outer surface of said conical target electrode;
   means for generating a magnetic field, said means for generating a magnetic field having a north pole located near said top opening of said conical target electrode and a south pole located near said bottom opening of said conical target electrode, said means for holding having said means for generating a magnetic field mounted therein whereby said field points to said bottom opening;
   means for clamping said conical target electrode within said means for holding;
   an anode, said anode being positioned on said centerline of said conical target electrode, said anode being located at said bottom opening of said conical target electrode, said anode adapted to have a ground voltage applied thereto; and
   a shield, said shield being positioned about said means for holding, said means for clamping, and said target conical electrode, said shield having a center opening therein for the passage of target material, means for mounting a substrate for receiving said target material located substantially outside of said opening, said shield adapted to being biased to a ground voltage.

2. A magnetron sputter source as defined in claim 1 wherein said conical target electrode is a sintered material for use in the deposition of a thin film of superconducting material.

3. A magnetron sputter source as defined in claim 1 wherein said anode at said bottom of said bottom opening of said conical target electrode forms a ground plane.

4. A magnetron sputter source as defined in claim 3 wherein said anode further includes a gas channel therethrough for the purposes of moving the sputtering target material to said substrate and providing a reactive gas.

5. A magnetron sputter source as defined in claim 1 wherein said means for generating a magnetic field comprise a plurality of permanent magnets.

6. A magnetron sputter source as defined in claim 1 wherein said shield opening is congruent with said top opening in said conical target electrode.

* * * * *